United States Patent [19]

Taylor

[11] Patent Number: 4,876,508

[45] Date of Patent: Oct. 24, 1989

[54] METHOD AND APPARATUS FOR NMR IMAGING

[75] Inventor: David G. Taylor, Guildford, England

[73] Assignee: Surrey Medical Imaging Systems Ltd., Guildford, England

[21] Appl. No.: 259,000

[22] PCT Filed: Feb. 4, 1988

[86] PCT No.: PCT/GB88/00066

§ 371 Date: Nov. 29, 1988

§ 102(e) Date: Nov. 29, 1988

[87] PCT Pub. No.: WO88/06288

PCT Pub. Date: Aug. 25, 1988

[30] Foreign Application Priority Data

Feb. 10, 1987 [GB] United Kingdom ................. 8702951

[51] Int. Cl.[4] .............................................. G01R 33/20
[52] U.S. Cl. .................................... 324/309; 324/307
[58] Field of Search ............... 324/300, 307, 309, 310, 324/311, 312, 313, 314; 128/653

[56] References Cited

U.S. PATENT DOCUMENTS

| | | | |
|---|---|---|---|
| 4,654,595 | 3/1987 | Sepponen | 324/307 |
| 4,673,880 | 6/1987 | Compton | 324/309 |
| 4,703,269 | 10/1987 | Young | 324/309 |
| 4,709,211 | 11/1987 | Machida | 324/309 |
| 4,748,411 | 5/1988 | Holland | 324/312 |
| 4,789,833 | 12/1988 | Nishimura | 324/309 |

FOREIGN PATENT DOCUMENTS

0109633A2 11/1983 European Pat. Off.
2124388A 7/1983 United Kingdom.

Primary Examiner—Michael J. Tokar
Attorney, Agent, or Firm—Kinney & Lange

[57] ABSTRACT

Apparatus for NMR imaging provides phase encoding and frequency encoding on the same axis. A magnetic gradient pulse $g_x$ providing phase encoding is followed by a gradient pulse 13 of, for example, constant amplitude to provide frequency encoding of processing nuclear spins.

6 Claims, 2 Drawing Sheets

PHASE ENCODING/PHASE ENCODING + FREQUENCY ENCODING PULSE SEQUENCE.

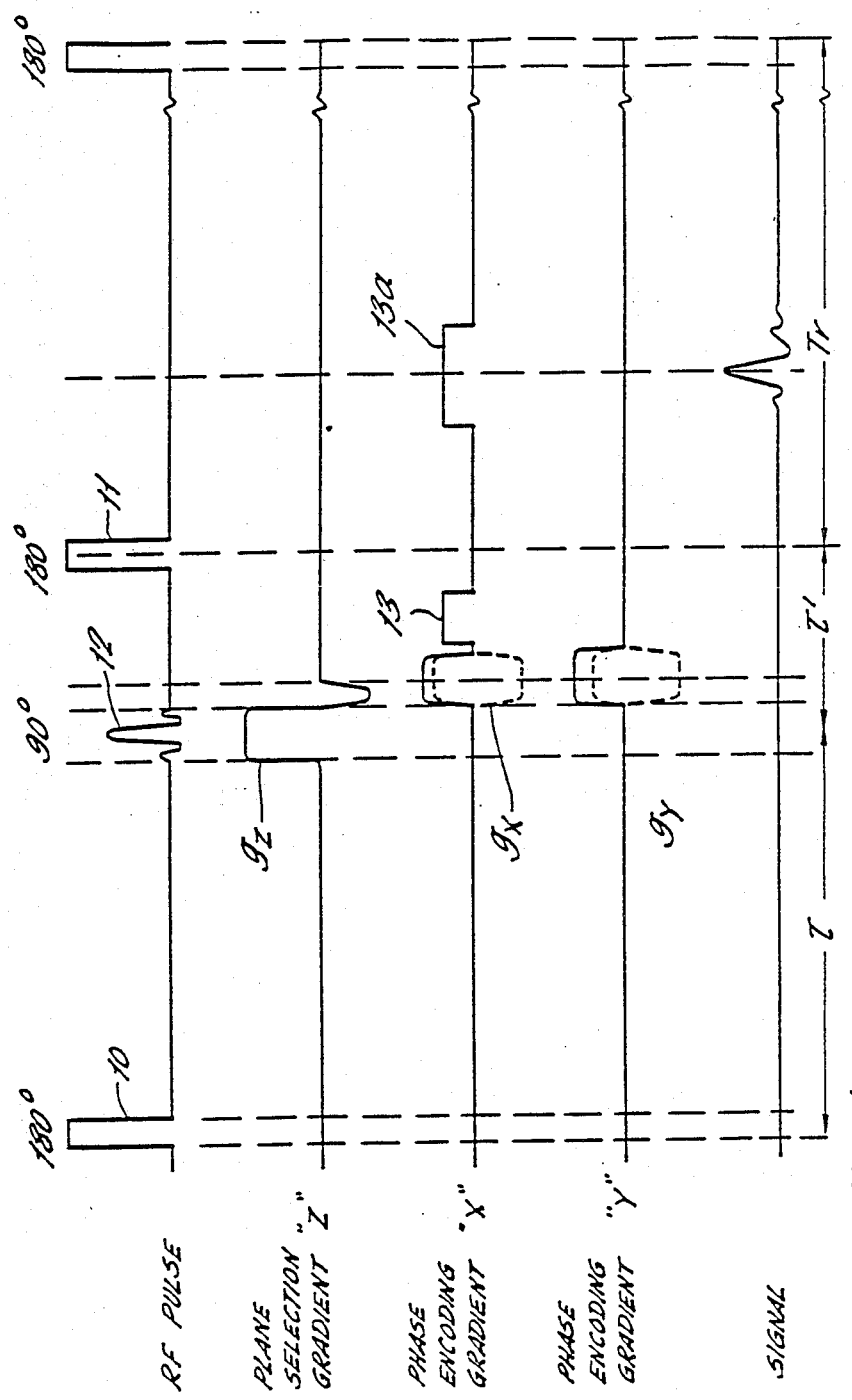

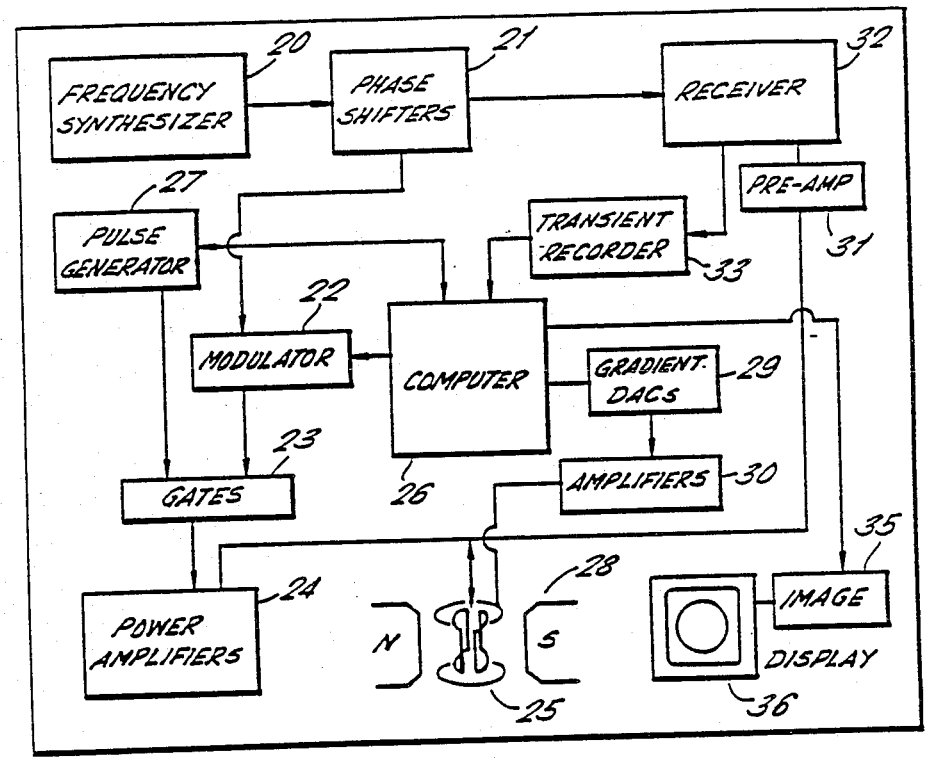
FIG. 2. BLOCK DIAGRAM OF THE NMR IMAGING SYSTEM.

METHOD AND APPARATUS FOR NMR IMAGING

BACKGROUND TO THE INVENTION

This invention relates to the production of image information of objects containing nuclear spin magnetic moments whose spatial distribution of density or relaxation time is detected by magnetic resonance techniques.

NMR imaging techniques require generally the application to an object of a static magnetic field, radio frequency excitation of nuclear spins and the application of magnetic field gradients along orthogonal axes. One of the principal problems in achieving a satisfactory image has, using known methods of measurement, been the production of a highly homogeneous static magnetic field. Poor field homogeneity results in a reduction in the signal to noise ratio in the image due to the requirement for large compensatory signal bandwidths. In addition various phenomena arising from an inhomogeneous field may further degrade the image quality.

It is known, for example from Edelstein et al, Phys. Med. Biol. Volume 25 (1980) pages 751 to 756 to provide a gradient and radio frequency pulse sequence which comprises a selective (90°) excitation of a thin slab of spins perpendicular to a first axis, projection of the spin density on to a second axis orthogonal to the first and phase encoding of spins on a third axis orthogonal to the first and second axes to allow spatial discrimination along the third axis, the phase encoding being achieved by the application of a half-sine wave pulse which is applied for the same time in each pulse sequence but having a strength varied in order to give spins at different "heights" varying amounts of phase twist according to the varying strength of the half-sine wave gradient pulses in the said third direction. A set of signals, representing values of the free induction decay signals measured at corresponding times and associated with different amplitudes of the gradient pulses in the third axis provide a two dimensional data set which when Fourier transformed in two dimensions provides image information in the selected plane. The technique essentially employs the precession frequency to encode spatial information in one direction and the phase of the precessing spins to encode in another direction. The technique provides satisfactory results if the static field is homogeneous. However, if the field is not homogeneous, that is to say the inhomogeneity is significant compared with the applied gradients, the inhomogeneity causes a geometric distortion in the direction of the static gradient. It is possible to reduce the geometric distortion by increasing the strength of the static gradient. However, this requires an increased signal bandwidth which will result in a reduction in the signal to noise ratio. Alternatively, the static field strength may be reduced but this is again undesirable because the signal to noise ratio decreases as the static field strength decreases.

It is further known, for example from GB-2 124 388 A and EP 0 109 633 A, that the use, in NMR imaging, of phase encoding in two directions at right angles in the same plane will allow spatial discrimination of spin densities in the said two directions. The use of phase encoding in two directions removes the geometric dependence of the image on the static field and accordingly could permit the performance of NMR imaging wherein the static magnetic field is significantly homogeneous. However, an unacceptable time penalty is paid for this method. Whereas the method of Edelstein takes N units of time to produce an N x N image, the two dimensional phase encoding technique requires Nz units of time for data collection. Imaging times of the order of hours are required to produce images of an acceptable spatial resolution. This is obviously not feasible where human subjects are involved.

SUMMARY OF THE INVENTION

One aspect of the present invention is based on the combination of phase and frequency encoding on the same axial axis. This combination permits the use of low strength frequency encoding gradients which minimize the signal bandwidth and thus maximize the signal to noise ratio. The use of phase encoding in combination with frequency encoding on the same axis substantially reduces the geometric dependance of the image on the static field whilst minimizing the data collection time. Accordingly the present invention greatly facilitates the performance of NMR imaging wherein the static magnetic field is significantly inhomogeneous.

According to one aspect of the invention there is provided a method of deriving image information from an object, comprising applying to said object a continuous static field from a magnet system and performing a repeated sequence of steps comprising exciting nuclear spins in the object by means of application of radio frequency radiation and obtaining a gradient echo or spin echo signal, the said sequence including the application of mutually simultaneous gradient pulses in two orthogonal directions and the magnitudes of the pulses varying from each sequence to the next to allow spatial discrimination in said directions by means of phase encoding of nuclear spins. In addition a gradient pulse of constant amplitude is applied in one of the directions to allow further spatial discrimination by means of frequency encoding of nuclear spins.

According to another aspect of the invention there is provided apparatus for deriving image information from an object, comprising a magnet system for applying a continuous magnetic field to an object, and an imaging system comprising means for applying radio frequency excitation to the object to obtain NMR signals and means for applying gradient fields to the object so as to provide spatial discrimination in an NMR image in at least two directions by means of phase encoding of nuclear spins in one dimension and a combination of phase encoding and frequency encoding in an orthogonal direction.

DESCRIPTION OF THE DRAWINGS

The following is a description of the invention in more detail, reference being made to the accompanying drawings, in which:

FIG. 1 illustrates an example pulse sequence characteristic of the present invention; and FIG. 2 is a schematic diagram of the NMR apparatus.

DETAILED DESCRIPTION

An embodiment of apparatus for performing the invention includes a magnet capable of producing a high field over a restricted but well characterized region. As will be explained the production of images within this region is achieved by the application of novel radio frequency pulse and magnetic field gradient pulse sequences.

The general arrangement of the apparatus is shown in FIG. 2. It is generally similar to known apparatus and accordingly need only be briefly described.

The apparatus includes a frequency synthesizer 20 which provides radio frequency signals that are fed through phase shifters 21 to an amplitude modulator 22 and thence through gates 23 to power amplifiers 24. The selection of radio frequency pulses for application to the r.f. coils disposed in known manner within a field coil system 25 is controlled by a computer 26 via a pulse generator 27. The static magnetic field is produced by a magnet 28. Gradient pulses are generated by the computer, are converted to analog form by digital to analog converters 29, amplified by amplifiers 30 and applied to appropriate coils provided within the field coil system for each of the three principal axes. The application and timing of the radio frequency pulses and the gradient pulses will be apparent from the discussion of the pulse sequence shown in FIG. 1.

Free induction decay or echo signals picked up by signal detection coils within the coil system pass through a preamplifier 31 and are processed in a receiver 32. Transient data obtained thereby are stored in a transient recorder 33 and subsequently employed by the computer in accordance with known image reconstruction techniques to provide image data for an image display 36 by way of a display controller 35.

An example of a pulse sequence characteristic of the invention is shown in FIG. 1. It is assumed that a continuous static magnetic field is directed along a z-axis. It should be noted that whilst in the following description the gradients $g_x$, $g_y$ and $g_z$ are assumed to be as in FIG. 1, the allocation of the plane selection gradient, the frequency encoding gradient, and phase encoding gradients to the z, x and y axes respectively is completely interchangeable.

The application of the first 180° radio frequency pulse 10 shown in the sequence is optional. This pulse and the following time interval introduce a dependence in the measured signal on the spin-lattice relaxation time $T_1$. Similarly, the final 180° radio frequency pulse and interval; $\tau'$ introduce a signal dependence on the spin-spin relaxation time $T_2$. The application of the second 180° pulse has the advantage of overcoming dephasing of the spin magnetization due to inhomogeneity in the magnet field.

Image plane selection is achieved by the application of an amplitude modulated radio frequency pulse 12 (the 90° pulse) in combination with the application of a plane selection magnetic field gradient, $g_z$. The amplitude modulation of the radio frequency pulse 12 is typically of the form $\sin \pi x / \pi x$ weighted with the Gaussian function. This constrains the frequency content of the pulse to a narrow band. The plane selection process is completed by the negative excursion of the plane selection gradient pulse $g_z$ (immediately following the application of the r.f. pulse) which rephases the precessing nuclear spins.

Further options include the use of spatially selective 180° pulses, derived in the same manner as the selective 90° pulse, in replacement of either or both of the 180° pulses shown in FIG. 1.

Phase encoding in two dimensions is achieved by incrementing the areas of gradient pulses $g_x$ and $g_y$. Typically but not necessarily these gradient pulses $g_x$ and $g_y$ are applied simultaneously and for the same length of time respectively in each pulse sequence but their strengths are varied (as indicated by dashed lines) to allow spatial discrimination along the x and y axes.

Preferably the strengths of the gradient pulses $g_x$ and $g_y$ are varied such that:

$$\gamma l_x \int g_x(t) \, dt = 2\pi n \quad (1)$$

and $$\gamma l_y \int g_y(t) \, dt = 2\pi m \quad (2)$$

where $l_x$ and $l_y$ are the total lengths of the sample in the x and y directions respectively, $\gamma$ is the gyromagnetic ratio, and n and m are integers.

One of the phase encoding gradient pulses, (in this example the $g_x$ pulse) may be followed by one or more gradient pulses 13, 13a of constant amplitude. These pulses effect frequency encoding of precessing nuclear spins for the same axis as the prior gradient pulse.

In order to distinguish M x N regions in the x-y plane, it is necessary to take M signals with, for example, m varying from $-M/2$ to $+(M/2)-1$ in integer steps, and for each of these values, p signals with n varying from $-p/2$ to $(p/2)-1$, again in integer steps. The frequency encoding then gives N/p points centered about each of the p locations in the x-direction. With appropriate ordering of the data in k-space i.e. prior to transformation, the complete reconstruction process may be achieved by inverse two-dimensional Fourier transformation.

The above combination of frequency and phase encoding requires p times longer for data collection, where p is usually between four and eight, for a given image than is required by spin-warp methods. This time penalty may be removed if unacceptable by the repeated recall of the signal using applied 180° r.f. pulses to overcome the dephasing effects caused by the inhomogeneity. Multiple phase encoding periods within the train of 180° pulses may then be utilized. For this purpose, the subsequence comprising the phase encoding gradient and frequency encoding pulses and the radio frequency excitation (represented by the 180° pulse) may be repeated many times for each initial excitation represented by the 90° pulse.

A schematic of the NMR imaging system is given in FIG. 2. The region of the body under investigation is positioned in the localized high field region of the magnet. A range of gradient coils and radio frequency coils are utilized depending on the region being examined. Typically the patient is positioned in the center of the field gradient coil set and r.f. transmitter coil.

Spin-lattice relaxation time ($T_1$) information is obtained by repeating the imaging process with and without the initial 180° r.f. pulse. Comparison of the data values for corresponding pixels in the two images then permits an estimate of $T_1$ in a manner identical to that for the standard $180°-\tau-90°$ sequence. Information relating to $T_1$ may also be extracted by repeating the sequence (without the initial 180° pulse) at a time interval $<T_1$. Comparison of the data with that from a repetition time $>>T_1$ then yields an estimate of $T_1$. A measure of the spin-spin relaxation time $T_2$ may be obtained by repeating the imaging sequence and varying the time between the 90° pulse and the following 180° pulse. The sequence would be repeated with a duration $>>T_1$. Again comparison of data values from corresponding pixels permits a measure of $T_2$ to be achieved.

Phase encoding in three dimensions may be achieved by applying a phase encoding gradient pulse instead of the plane selection gradient pulse.

Further variants of the technique include; the replacement of the 90° pulse by one having a reduced pulse power and hence a tip angle less than 90°, the replacement of the optional initial 180° pulse by one or more pulses of arbitrary tip angle and the generation of a gradient echo signal rather than a spin echo signal following the 90° pulse by means of an initial negative excursion of the frequency encoding gradient followed by the positive application of this gradient. In this instance the frequency encoding gradient pulse should follow the phase encoding gradient pulse. The 180° pulse following the 90° pulse would not be required in this instance.

I claim:

1. A method of NMR imaging in which phase and frequency encoding of precessing nuclear spins are performed on the same spatial axis.

2. A method of deriving image information from an object, comprising applying to said object a continuous static magnetic field from a magnet system and performing a repeated sequence of steps comprising exciting nuclear spins in the object by means of the application of radio frequency radiation and obtaining a gradient echo or spin echo signal, the said sequence including the application of gradient pulses in at least two orthogonal directions and the areas of the pulses varying from each sequence to the next to allow spatial discrimination in said directions by means of phase encoding of nuclear spins, a gradient pulse of constant amplitude being applied in one of the directions to allow further spatial discrimination by means of frequency encoding of nuclear spins.

3. Apparatus for deriving image information from an object, comprising a magnet system for applying a continuous magnetic field to an object, and an imaging system comprising means for applying radio frequency excitation to the object to obtain NMR signals and means for applying gradient fields to the object so as to provide spatial discrimination in an NMR image in at least two directions by means of phase encoding of nuclear spins in one dimension and a combination of phase encoding and frequency encoding of nuclear spins in an orthogonal direction.

4. Apparatus according to claim 3 in which image plane selection is provided by the application of an amplitude modulated 90° radio frequency pulse and the application of a magnetic field gradient on an axis orthogonal to said two directions.

5. Apparatus according to claim 3 or claim 4 in which the means for applying gradient pulses is arranged to apply, in respect of said orthogonal direction, a phase encoding gradient pulse and a pulse of substantially constant amplitude.

6. Apparatus according to claim 3 or claim 4 in which the means for applying gradient pulses is arranged to apply, in respect of said orthogonal direction, a phase encoding gradient pulse followed by a frequency encoding gradient which comprises an initial negative excursion followed by a positive excursion.

* * * * *